(12) United States Patent
Liu et al.

(10) Patent No.: US 9,119,286 B2
(45) Date of Patent: Aug. 25, 2015

(54) COVER ASSEMBLY AND ELECTRONIC DEVICE USING THE SAME

(71) Applicant: ASUSTeK COMPUTER INC., Taipei (TW)

(72) Inventors: Yu-Se Liu, Taipei (TW); Hsin-Hung Hsiao, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 174 days.

(21) Appl. No.: 13/902,231

(22) Filed: May 24, 2013

(65) Prior Publication Data

US 2013/0321992 A1 Dec. 5, 2013

Related U.S. Application Data

(60) Provisional application No. 61/653,537, filed on May 31, 2012.

(30) Foreign Application Priority Data

Apr. 12, 2013 (TW) .............................. 102113043 A

(51) Int. Cl.
| | |
|---|---|
| *G06F 1/16* | (2006.01) |
| *E05D 11/10* | (2006.01) |
| *E05D 11/06* | (2006.01) |
| *E05D 11/08* | (2006.01) |
| *E05D 11/00* | (2006.01) |

(Continued)

(52) U.S. Cl.
CPC .............. *H05K 7/00* (2013.01); *E05D 11/0054* (2013.01); *E05D 11/06* (2013.01); *E05D 11/08* (2013.01); *E05D 11/10* (2013.01); *E05D 11/1007* (2013.01); *E05D 11/1028* (2013.01); *G06F 1/1681* (2013.01); *G06F 1/1683* (2013.01)

(58) Field of Classification Search
CPC ..... E05D 11/0054; E05D 11/06; E05D 11/08; E05D 11/10; E05D 11/1007; E05D 11/1028; E05D 11/1035
USPC .......... 361/679.27, 679.28, 755, 610, 679.04; 248/213.1, 372.1, 393, 397; 16/221, 16/247, 250, 251, 319, 337, 342, 374, 16/379; 220/831, 832
See application file for complete search history.

(56) References Cited

U.S. PATENT DOCUMENTS

| | | | |
|---|---|---|---|
| 2003/0098313 A1* | 5/2003 | Cheng ........................... | 220/840 |
| 2004/0246667 A1* | 12/2004 | Maskatia et al. .............. | 361/683 |

FOREIGN PATENT DOCUMENTS

EP              6274 A1 *   1/1980

*Primary Examiner* — Hoa C Nguyen
*Assistant Examiner* — Binh Tran
(74) *Attorney, Agent, or Firm* — Muncy, Geissler, Olds & Lowe, P.C.

(57) ABSTRACT

A cover assembly for covering a pivot of an electronic device is disclosed. The pivot connects a first component and a second component of the electronic device. The cover assembly is disposed at one side of the pivot, and the cover assembly includes a first covering element and a second covering element. A first end of the first covering element is connected to the first component, and a second end of the first covering element includes a first limit part. A first end of the second covering element is connected to the second component, and a second end of the second covering element includes a second limit part. The first covering element is overlapped with the second covering element. When the pivot rotates, the first limit part and the second limit part move correspondingly.

8 Claims, 8 Drawing Sheets

(51) Int. Cl.
*H05K 5/00* (2006.01)
*H05K 7/00* (2006.01)
*A47G 29/00* (2006.01)
*A45D 19/04* (2006.01)
*A47J 47/16* (2006.01)
*F16M 13/00* (2006.01)
*E05D 7/00* (2006.01)

COVER ASSEMBLY AND ELECTRONIC DEVICE USING THE SAME

CROSS-REFERENCE TO RELATED APPLICATION

This application claims the priority benefit of U.S. provisional application Ser. No. 61/653,537, filed on May 31, 2012, and Taiwan application serial no. 102113043, filed on Apr. 12, 2013. The entirety of the above-mentioned patent applications are hereby incorporated by reference herein and made a part of specification.

BACKGROUND OF THE INVENTION

1. Field of the Invention

The invention relates to a cover assembly and, more particularly, to a cover assembly covering a pivot of an electronic device.

2. Description of the Related Art

As technology develops, requirements of electronic devices, such as a desktop computer or a portable computer, gradually increase. Taking an early desktop computer as an example, a host and a display screen are separate. However, the desktop computer has a large size, and as technology develops, components of the desktop computer become smaller. Thus, an integrated electronic device (which means the host and the display screen are combined) is produced.

As shown in FIG. 1, the integrated electronic device 1 includes a display screen 11 and a base 12, and the display screen 11 is connected to the base 12 via, a supporting element 13. The supporting element 13 is connected to the display screen 11 via a pivot 14, and thus the display screen 11 can rotate relatively to the supporting element 13. However, the inner structure of the pivot 14 is exposed from the electronic device 1, which affects the beauty in appearance, and dust easily accumulates.

Moreover, the electronic device may integrate main components, such as a central processing unit (CPU), a memory, a hard disk drive and an optical disk drive into a base 12. Thus, a connecting cable 15 is disposed between the display screen 11 and the base 12 to electrically connect the display screen 11 and the main components. The connecting cable 15 is usually disposed inside the supporting element 13 in a consideration of beauty and dust proof. However, a part of the connecting cable 15 still is exposed from the pivot 14, and dust is easy to attach to the connecting cable 15, which affects whole operation of the electronic device 1.

BRIEF SUMMARY OF THE INVENTION

A cover assembly for covering a pivot of an electronic device is disclosed. The pivot is connected between a first component and a second component of the electronic device, and the cover assembly is disposed at one side of the pivot. The cover assembly includes a first covering element and a second covering element. A first end of the first covering element is connected to the first component, and a second end of the first covering element includes a first limit part. A first end of the second covering element is connected to the second component, and a second end of the second covering element includes a second limit part. The first covering element is overlapped with the second covering element, and when the pivot rotates, the first limit part and the second limit part move correspondingly.

An electronic device is further disclosed. The electronic device includes a first component, a second component, a pivot and a cover assembly. The pivot is connected between the first component and the second component. The cover assembly covers the pivot and includes a first covering element and a second covering element. A first end of the first covering element is connected to the first component, and a second end of the first covering element includes a first limit part. A first end of the second covering element is connected to the second component, and a second end of the second covering element includes a second limit part. The first covering element is overlapped with the second covering element, and when the pivot rotates, the first limit part and the second limit part move correspondingly.

As stated above, via the first covering element and the second covering element, the pivot is covered by the cover assembly in rotating. The pivot does not expose from the electronic device to keep wholeness in appearance of the electronic device and prevent dust.

Moreover, the connecting cable of the electronic device may be disposed between the cover assembly and the pivot to prevent dust and keep operation stability of the electronic device.

These and other features, aspects and advantages of the present invention will become better understood with regard to the following description, appended claims, and accompanying drawings.

DETAILED DESCRIPTION OF THE EMBODIMENTS

An electronic device and a cover assembly thereof are illustrated with relating figures, and the same symbols denote the same components.

Figure 1:
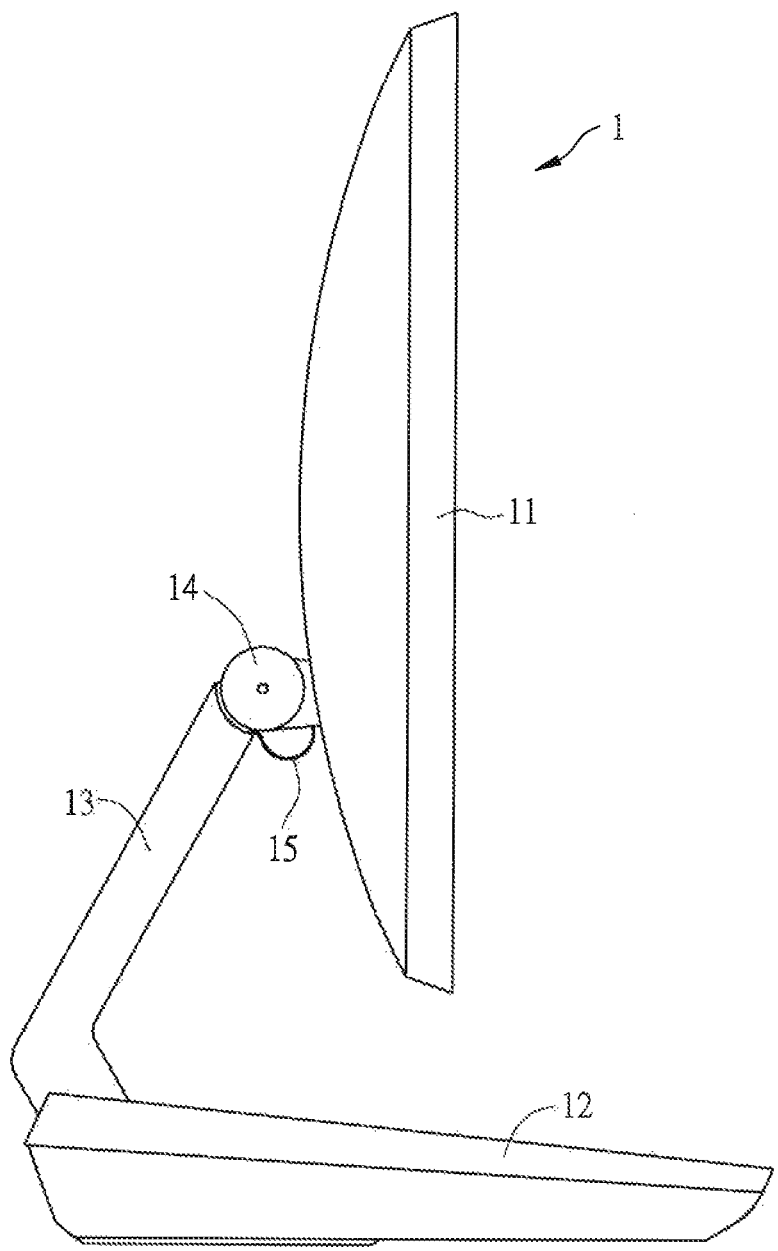
FIG. 1 is a schematic diagram showing a conventional integrated electronic device.
Figure 2A:
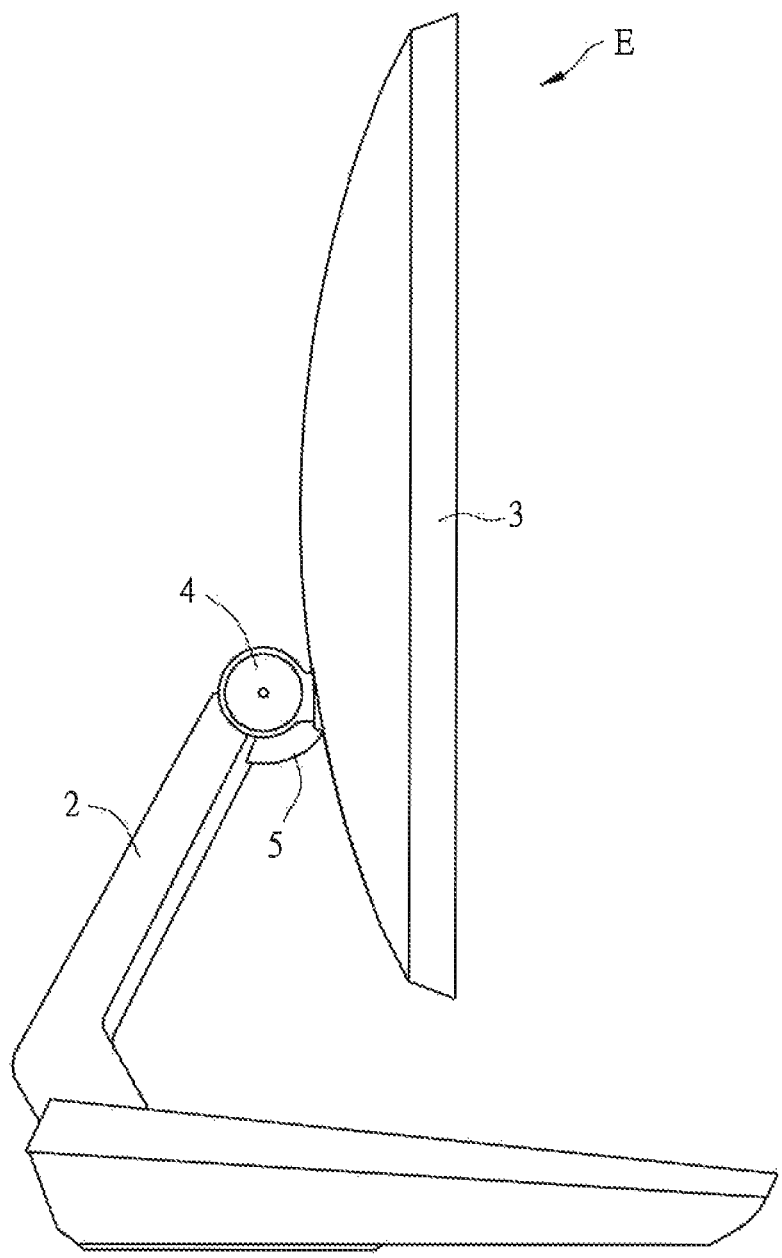
FIG. 2A is a schematic diagram showing an electronic device in a first embodiment.
Figure 2B:
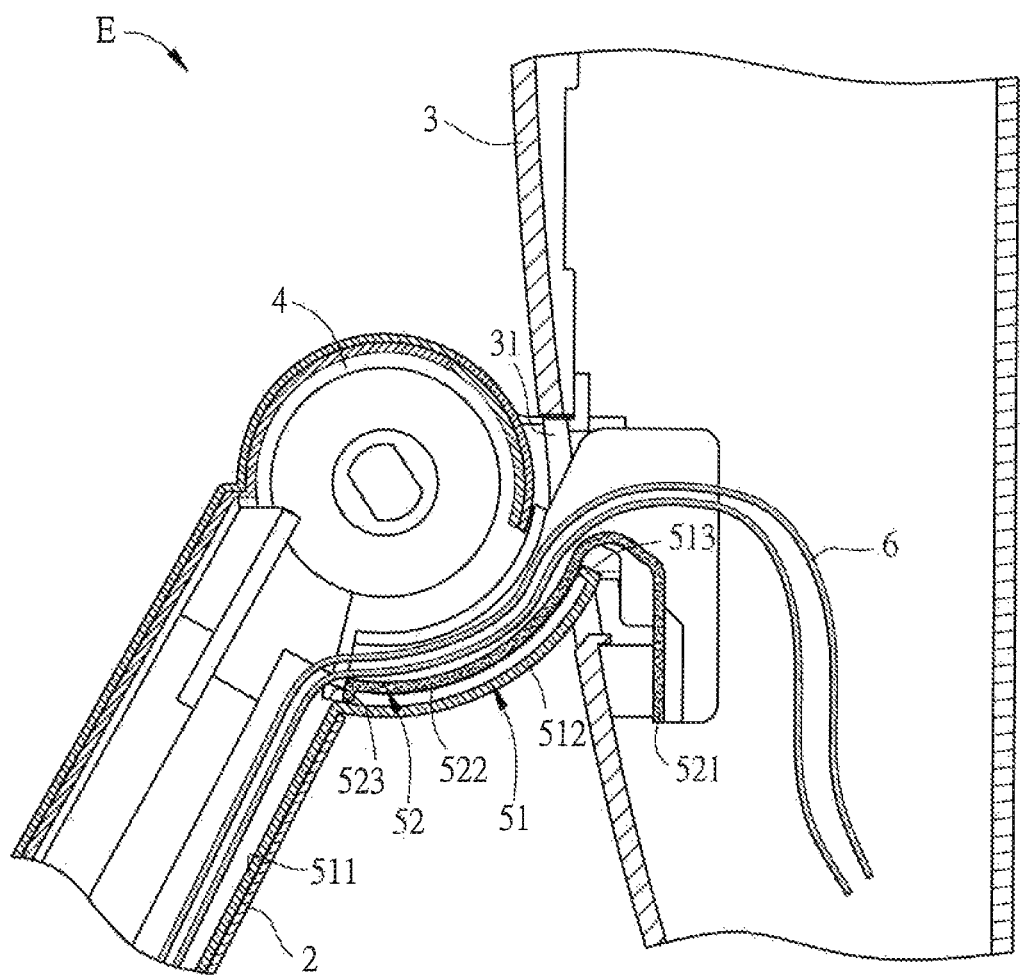
FIG. 2B is an enlarged sectional diagram showing a cover assembly in FIG. 2A.
Figure 3A:
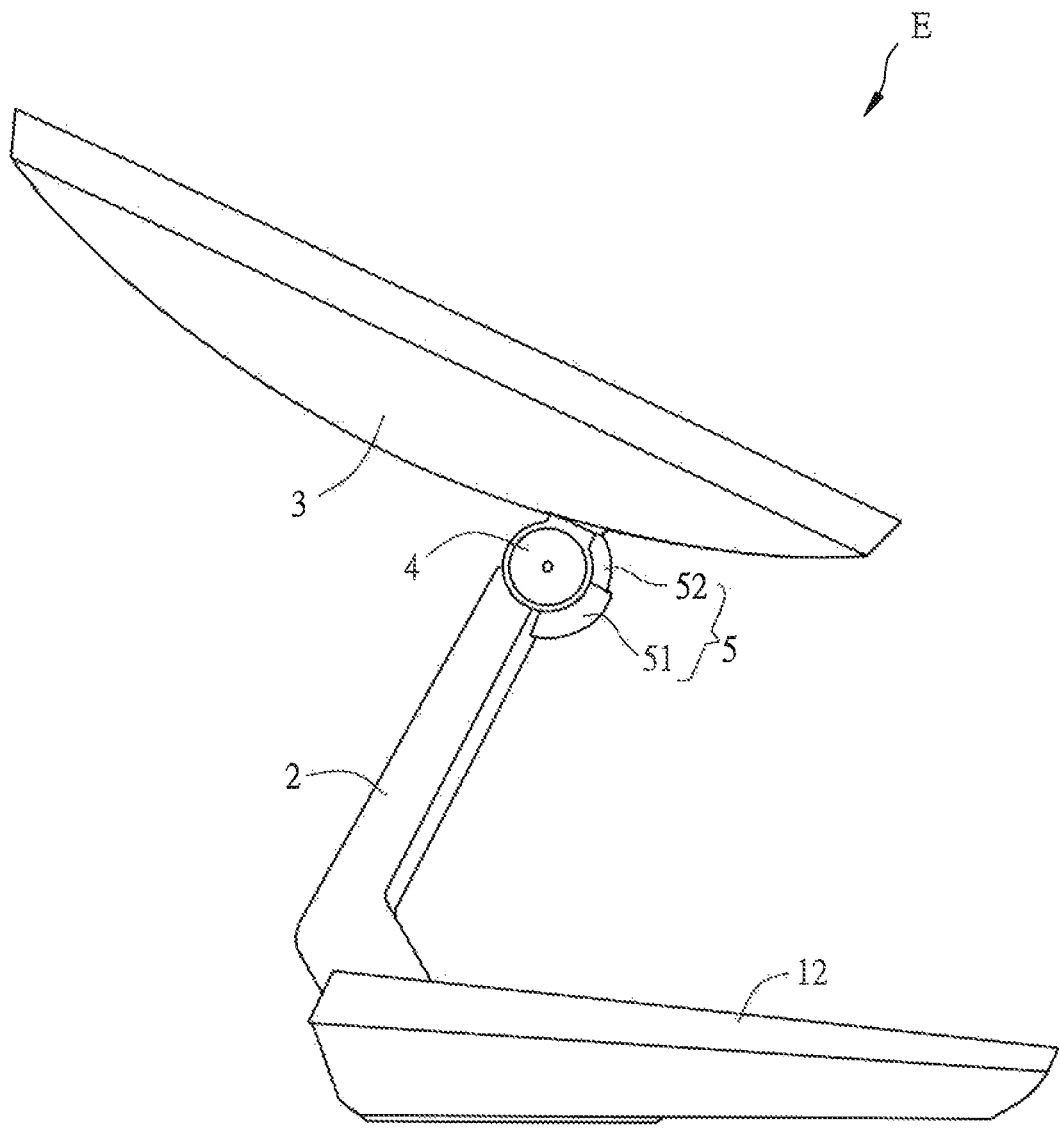
FIG. 3A is a schematic diagram showing moving of the cover assembly in FIG. 2A.

FIG. 2A is a schematic diagram showing an electronic device in a first embodiment, and FIG. 2B is an enlarged sectional diagram showing a cover assembly in FIG. 2A. Please refer to FIG. 2A and FIG. 2B, an electronic device E includes a first component 2, a second component 3, a pivot 4 and a cover assembly 5. The pivot 4 is connected between the first component 2 and the second component 3 of the electronic device E. The cover assembly 5 can be applied to any electronic device E with the pivot 4. In the embodiment, the electronic device is an integrated electronic device, the first component 2 is a supporting element, and the second component 3 is a tablet display device. The tablet display device may be a touch control tablet display device, which is not limited herein. Thus, the second component 3 (the tablet display device) can rotate relatively to the first component 2 (the supporting element) via the pivot 4, and the cover assembly 5 covers the pivot 4 (as shown in FIG. 3A), which is not limited herein.

As shown in FIG. 2A and FIG. 2B, the cover assembly 5 is disposed at one side of the pivot 4 and includes a first covering element 51 and a second covering element 52. The first covering element 51 includes a first connecting part 511, a first body 512 and a first limit it part 513. The first connecting part 511 is formed at a first end of the first covering element 51, and the first limit part 513 is formed at a second end of the first covering element 51. The first covering element 51 is connected to the first component 2 via the first connecting part 511. The first covering element 51 may be connected to the first component 2 via gluing, locking, inserting or fastening, which is not limited herein. Moreover, the first component 2 and the first covering element 51 may be integratedly formed, and the first covering element 51 extends from a first end of the first component 2 near the pivot 4, which is not limited herein. The first body 512 is an arc surface fitting the shape of the pivot 4 and disposed corresponding to the pivot 4. The first limit part 513 is at one end of the first covering element 51 away from the first component 2, which means the first connecting part 511 and the first limit part 513 are disposed at two opposite ends of the first body 512.

The first end of the second covering element 52 is connected to the second component 3, and the second covering element 52 also includes a second connecting part 521, a second body 522 and a second limit part 523. The second connecting part 521 is disposed at the first end of the second covering element 52, and the second limit part 523 is disposed at the second end of the second covering element 52. In the embodiment, the second component 3 further has an opening 31, and the second covering element 52 is locked to the opening 31 via the second connecting part 521. The second covering element 52 is further fixed to the second component 3 via locking (not shown).

The second component 3 may also be connected to the second covering element 52 via fastening or gluing, or they are integratedly formed. The second component 3 and the second covering element 52 may be integratedly formed, and the second covering element 52 extends from a first end of the second component 3 near the pivot 4, which is not limited herein. The second body 522 is an arc surface fitting the shape of the pivot 4 and disposed corresponding to the pivot 4 and the first body 512, which means the first covering element 51 and the second covering element 52 are overlapped. In the embodiment, the second body 522 is disposed between the first body 512 and the pivot 4. The second limit part 523 is disposed at one end of the second covering element 52 away from the second component 3, and the first limit part 513 is disposed corresponding to the second limit part 523.

The first limit part 513 and the second limit part 523 are protruding structures corresponding to each other. In the embodiment, the first limit part 513 is a protruding structure extending toward the pivot 4, and the second limit part 523 is a protruding structure extending away from the pivot 4. Thus, when the pivot 4 rotates, the first limit part 513 and the second limit part 523 move correspondingly and are locked to each other, and the pivot 4 stops rotating.

Figure 3B:
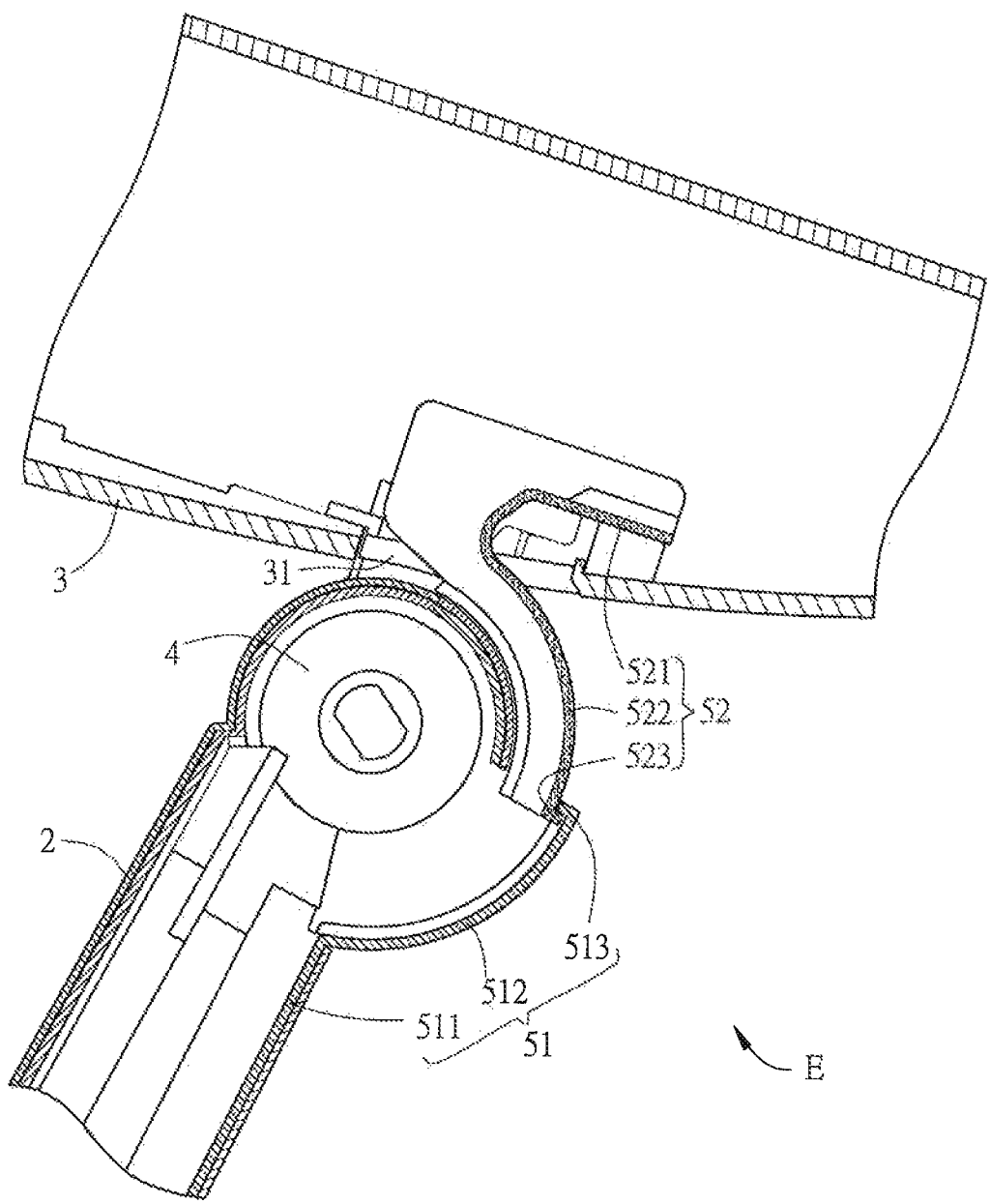
FIG. 3B is an enlarged sectional diagram showing the cover assembly in FIG. 3A.

FIG. 3A is a schematic diagram showing moving of the cover assembly in FIG. 2A, and FIG. 3B is an enlarged sectional diagram showing the cover assembly in FIG. 3A. Please refer to FIG. 3A and FIG. 3B, when the second component 3 rotates around the pivot 4, the second covering element 52 moves and drives the second limit part 523 to move until the second limit part 523 abuts the first limit part 513 (as shown in FIG. 3B). It may also be that the first limit part 513 is a protruding structure extending away from the pivot 4, and the second limit part 523 is a protruding structure extending towards the pivot 4, which can achieve a same function. Thus, via the first covering element 51 and the second covering element 52, no matter how the pivot 4 of the electronic device E rotates, it is covered by the cover assembly 5.

Please refer to FIG. 2B, a gap exists between the second body 522 of the cover assembly 5 and the pivot 4. Since the second component 3 is a tablet display device, the electronic device E further includes a connecting cable 6 extending from the second component 3 (the tablet display device), as shown in FIG. 2B. The connecting cable 6 is accommodated between the cover assembly 5 and the pivot 4, and thus the connecting cable 6 is not exposed to prevent dust and maintain the operation stability of the electronic device E.

Figure 4A:
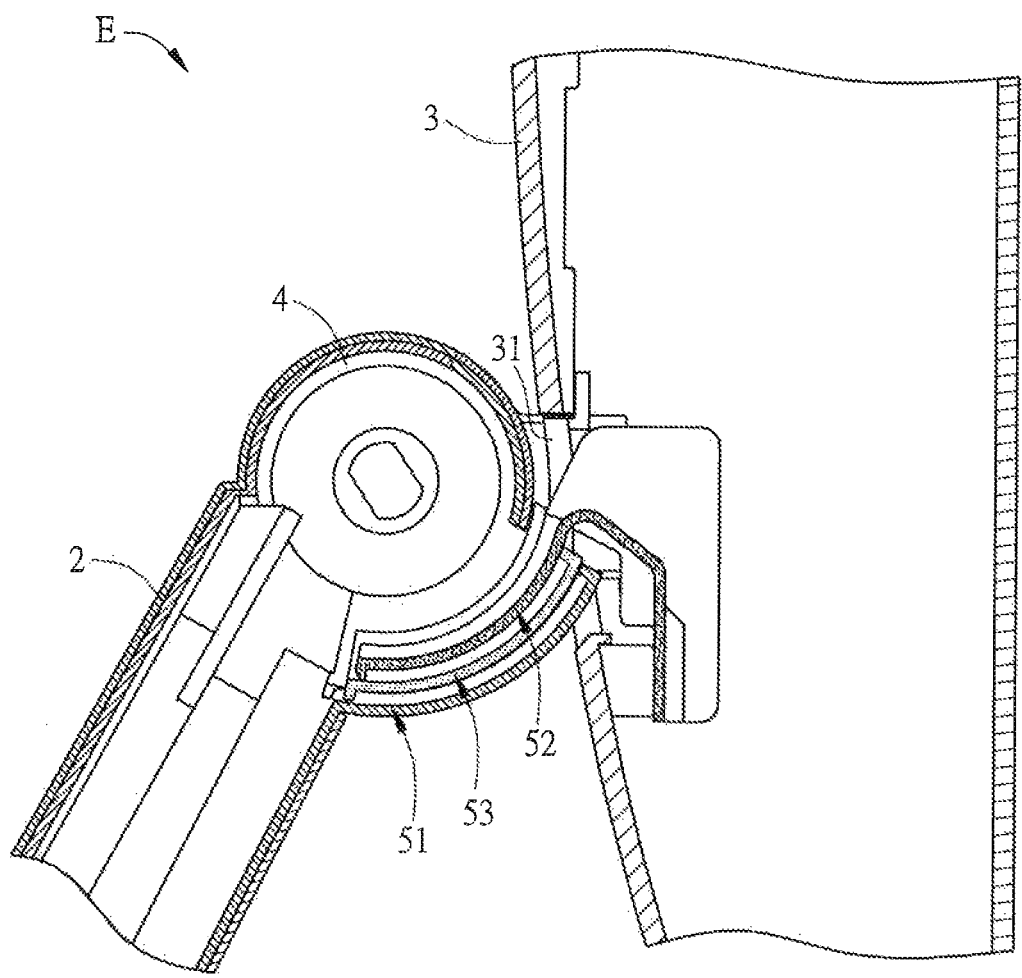
FIG. 4A is an enlarged sectional diagram showing a cover assembly in a second embodiment.
Figure 4B:
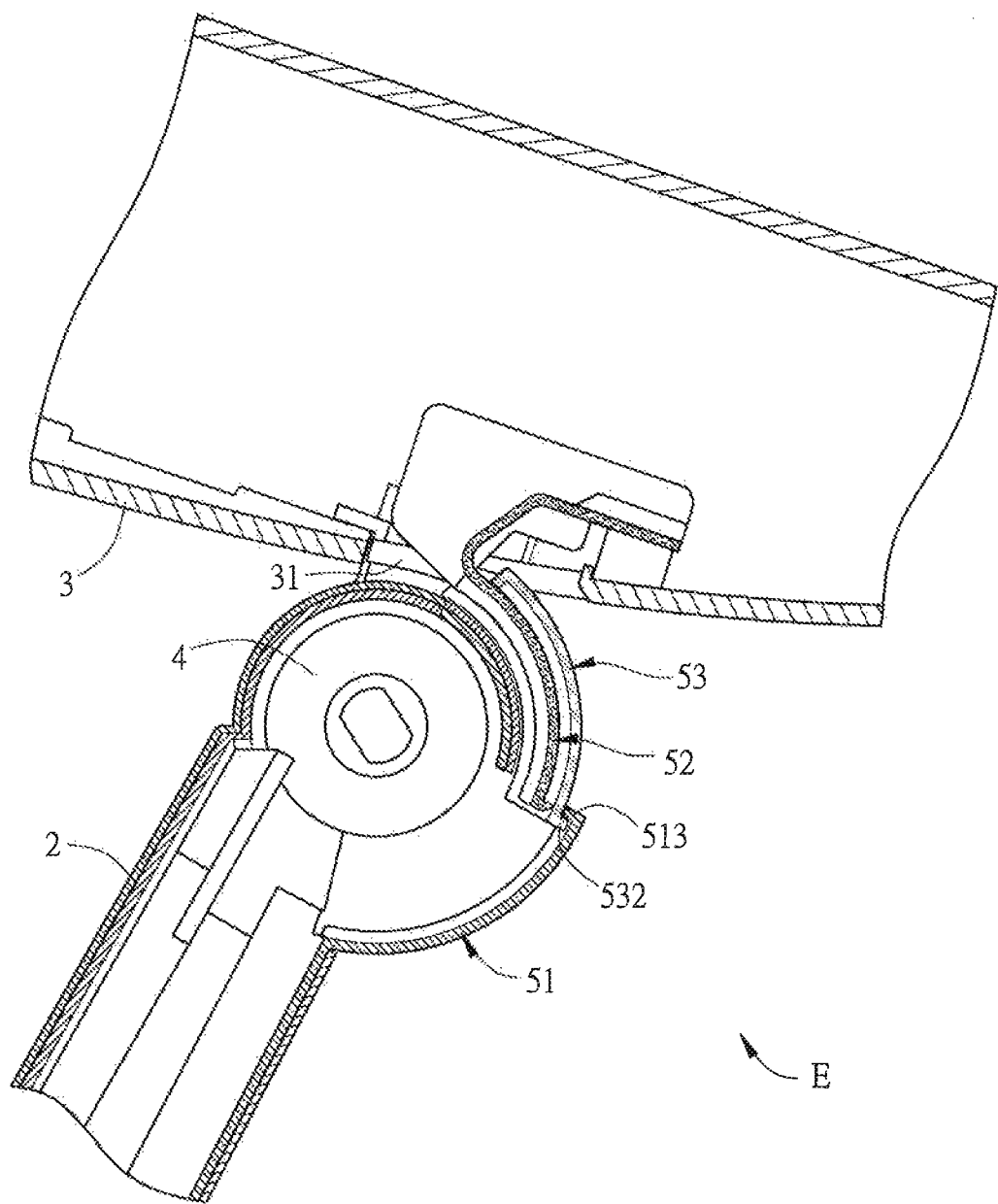
FIG. 4B and FIG. 4C are schematic diagrams showing moving of the cover assembly in FIG. 4A.
Figure 4C:
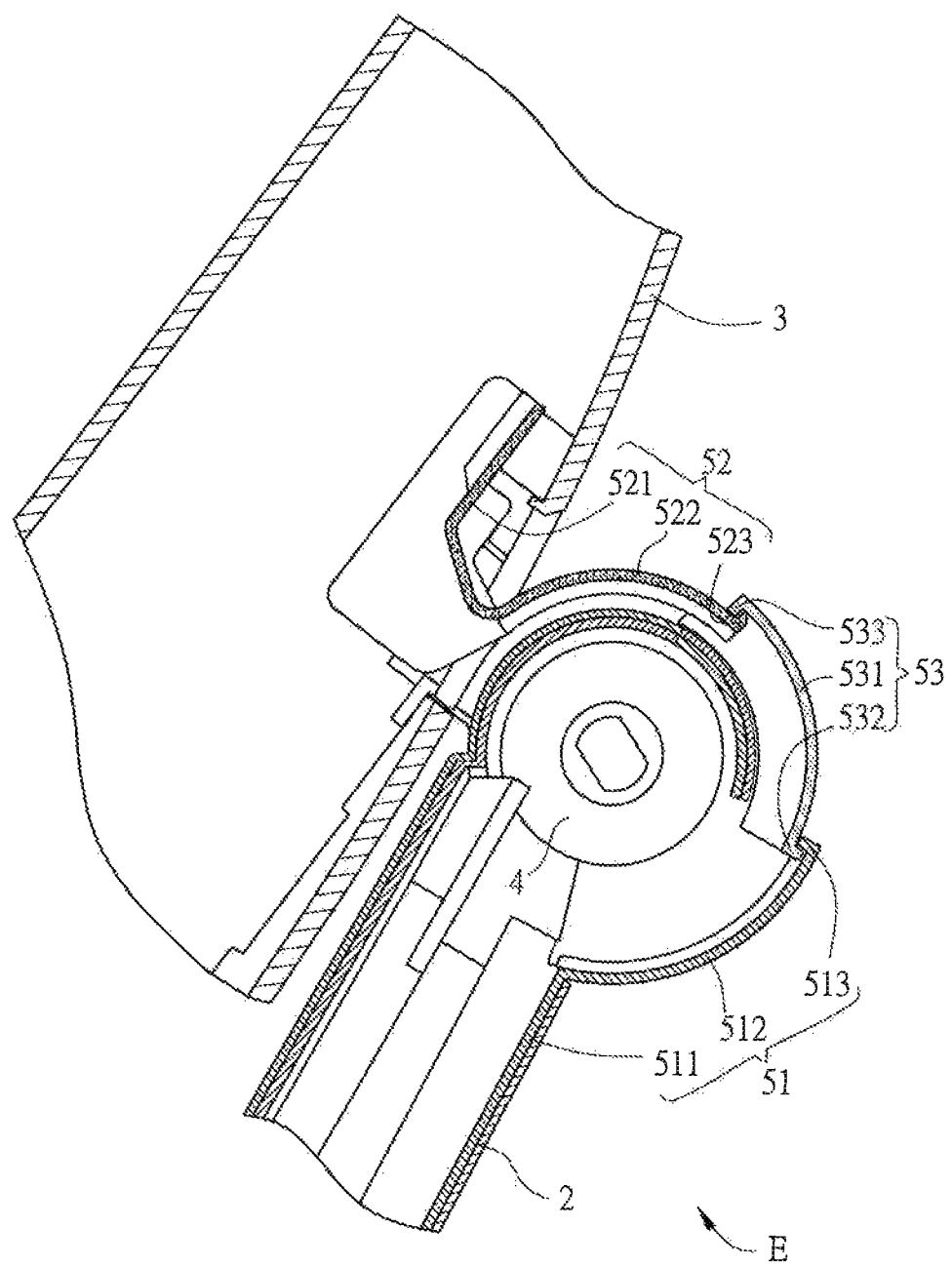

FIG. 4A is an enlarged sectional diagram showing a cover assembly in a second embodiment, and FIG. 4B and FIG. 4C are schematic diagrams showing moving of the cover assembly in FIG. 4A. Please refer to FIG. 4A to FIG. 4C, the cover assembly 5 further includes at least one third covering element 53 to enable the second component 3 to rotate by a larger angle around the pivot 4 (as shown in FIG. 4B to FIG. 4C). The third covering element 53 is disposed between the first covering element 51 and the second covering element 52 (as shown in FIG. 4A).

The detail symbols are shown in FIG. 4C to keep other figures simple and clean. Please refer to FIG. 4C and FIG. 4A, the third covering element 53 includes a third body 531, a third limit part 532 and a fourth limit part 533. The third limit part 532 is disposed at one end of the third covering element 53, and the fourth limit part 533 is disposed at the other end, which means the third limit part 532 and the fourth limit part 533 are disposed at two opposite ends of the third body 531.

The first covering element 51, the second covering element 52 and the third covering element 53 are overlapped, and the third limit part 532 and the fourth limit part 533 are also protruding structures. The protruding structure of the third limit part 532 and the protruding structure of the first limit part 513 extend towards opposite directions, so as to make the third limit part 532 and the first limit part 513 locked to each other when the pivot 4 rotates, as shown in FIG. 4B.

The protruding structure of the fourth limit part 533 and the protruding structure of the second limit part 523 also extend towards opposite directions to enable the pivot 4 to rotate by a larger angle, as shown in FIG. 4C, and the fourth limit part 533 can be locked to the second limit part 523. When the third limit part 532 is locked to the first limit part 513 and the fourth limit part 533 is locked to the second limit part 523, the pivot 4 stops rotating.

It can be determined whether the third covering element 53 is used according to the rotating angle of the second component 3, and even the number of the third covering element 53 can be increased. When the third limit part 532 is locked to the first limit part 513 and the fourth limit part 533 is locked to the second limit part 523, the pivot 4 stops rotating. The invention can be applied to the electronic device with a flat screen to enable the second component 3 (the tablet display device) placed horizontally at the first component 2 (the supporting element), as shown in FIG. 4C. Furthermore, the rotating angle of the second component 3 can be increased by increasing the length of the first covering element 51 or the second covering element 52, which is not limited herein.

A cover assembly is further disclosed to cover a pivot of an electronic device. The pivot is connected between a first component and a second component. The cover assembly includes a first covering element and a second covering element. The first covering element is connected to the first component, and a first limit part is formed at one end of the first covering element away from the first component. The second covering element is connected to the second component, and a second limit part is formed at one end of the second covering element away from the second component. The first covering element and the second covering element are overlapped, and when the pivot rotates, the first limit part and the second limit part move correspondingly. The components of the cover assembly and connections therebetween are illustrated in above, which is omitted herein.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A cover assembly for covering a pivot of an electronic device, wherein the pivot is connected between a first component and a second component of the electronic device, and the cover assembly is disposed at one side of the pivot, the cover assembly comprising:
    a first covering element, wherein a first end of the first covering element is connected to the first component, and a second end of the first covering element includes a first limit part;
    a second covering element, wherein a first end of the second covering element is connected to the second component, and a second end of the second covering element includes a second limit part; and
    at least one third covering element disposed between the first covering element and the second covering element, wherein one end of the third covering element includes a third limit part, and the other end includes a fourth limit part;
    wherein the first covering element is overlapped with the second covering element, and when the pivot rotates, the first limit part and the second limit part move correspondingly.

2. The cover assembly according to claim 1, wherein the first limit part and the second limit part are protruding structures corresponding to each other.

3. The cover assembly according to claim 1, wherein the third limit part and the fourth limit part are protruding structures, and when the pivot rotates, the third limit part is locked with the first limit part, and the fourth limit part is locked with the second limit part.

4. The cover assembly according to claim 1, wherein a connecting cable of the electronic device is accommodated between the cover assembly and the pivot.

5. An electronic device comprising:
    a first component;
    a second component;
    a pivot connected between the first component and the second component;
    a cover assembly disposed at one side of the pivot and covering the pivot, wherein the cover assembly includes:
        a first covering element, wherein a first end of the first covering element is connected to the first component, and a second end of the first covering element includes a first limit part; and
        a second covering element, wherein a first end of the second covering element is connected to the second component, and a second end of the second covering element includes a second limit part; and
        at least one third covering element disposed between the first covering element and the second covering element, wherein one end of the third covering element includes a third limit part, and the other end includes a fourth limit part;
    wherein the first covering element is overlapped with the second covering element, and when the pivot rotates, the first limit part and the second limit part move correspondingly.

6. The electronic device according to claim 5, wherein the first limit part and the second limit part are protruding structures corresponding to each other.

7. The electronic device according to claim 5, wherein the third limit part and the fourth limit part are protruding structures.

8. The electronic device according to claim 5, wherein a connecting cable of the electronic device is accommodated between the cover assembly and the pivot.

* * * * *